United States Patent [19]
Williams

[11] Patent Number: 4,594,563
[45] Date of Patent: Jun. 10, 1986

[54] SIGNAL COMPARISON CIRCUIT AND PHASE-LOCKED-LOOP USING SAME

[75] Inventor: Marshall Williams, Fremont, Calif.

[73] Assignee: Ampex Corporation, Redwood City, Calif.

[21] Appl. No.: 667,677

[22] Filed: Nov. 2, 1984

[51] Int. Cl.$^4$ .................. H03D 13/00; H03L 7/18
[52] U.S. Cl. ........................ 331/1 A; 331/27; 307/516; 307/526; 328/134
[58] Field of Search ................. 331/1 A, 25, 27; 307/525, 526, 528, 516; 328/133, 134

[56] References Cited

U.S. PATENT DOCUMENTS

| | | | |
|---|---|---|---|
| 3,663,884 | 5/1972 | Pattantyus | 328/134 |
| 4,151,485 | 4/1979 | LaFratta | 331/27 X |
| 4,378,509 | 3/1983 | Hatchett et al. | 307/528 |

OTHER PUBLICATIONS

CMOS Integrated Circuit Manual, 1980, published by RCA, pp. 714–717.

*Primary Examiner*—Siegfried H. Grimm
*Attorney, Agent, or Firm*—G. Michael Zimmerman; Ralph L. Mossino; George B. Almeida

[57] ABSTRACT

A signal comparison circuit is described which is implementable by a logic gate array structure without introducing the possibility of the large, incorrect error signals possible with phase comparators implemented by logic gate array structures. The circuit has particular applicability to phase-locked-loop circuits because it compares the frequency and phase of a first input signal with the frequency and phase of a second input signal in an error-free manner. A first master flip-flop triggered by the first input signal produces negative pulses, under the control of a NAND latch. A second master flip-flop is triggered by the second input signal to produce negative pulses, under control of the same NAND latch. The NAND latch is responsive to the outputs of the first and second master flip-flops. The first and second input signals are each delayed, and the delayed input signals are respectively used to trigger first and second slave flip-flops (which are slaves to the two master flip-flops). The outputs of the slave flip-flops control the state of a NOR latch. The NAND latch indicates which of the two input signals leads the other in phase, while the NOR latch indicates which of the input signals has a higher frequency than the other. The outputs of the NAND and NOR latches are decoded and provide a control voltage to a voltage-controlled oscillator to vary the frequency of the oscillator in accordance with a reference frequency.

15 Claims, 3 Drawing Figures

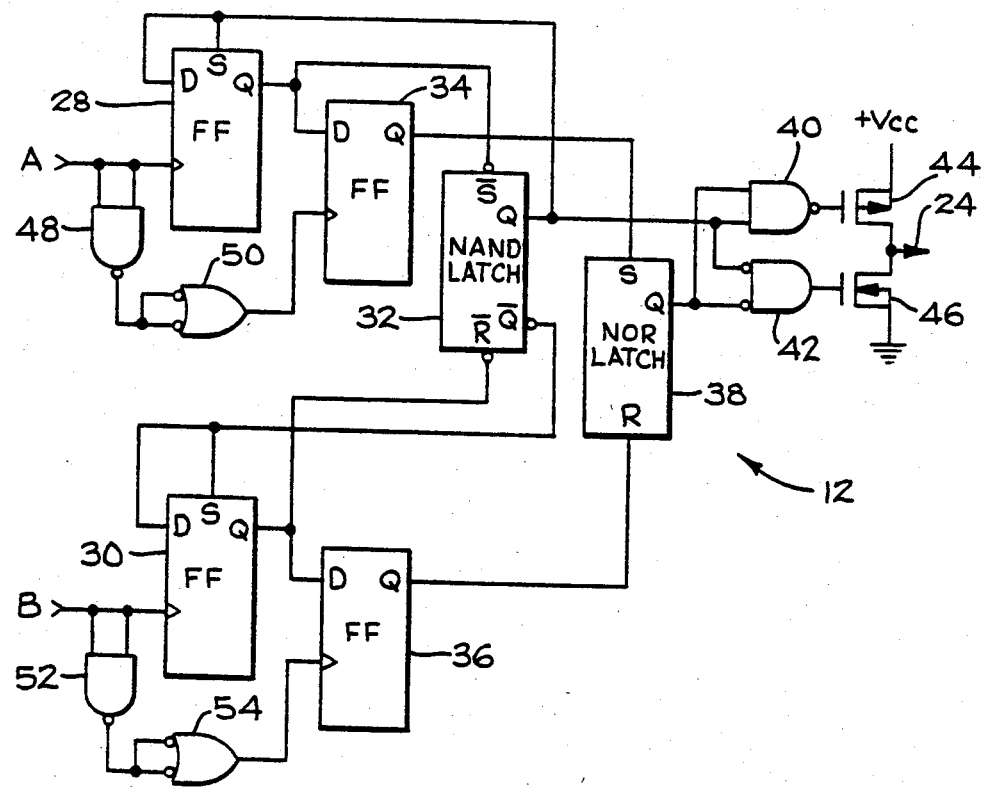
FIG_1
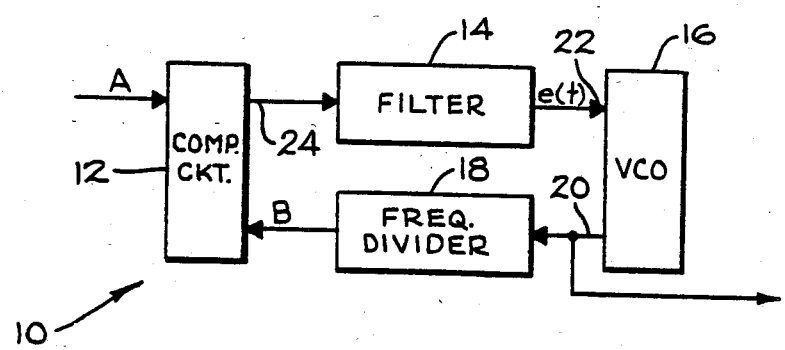
FIG_3

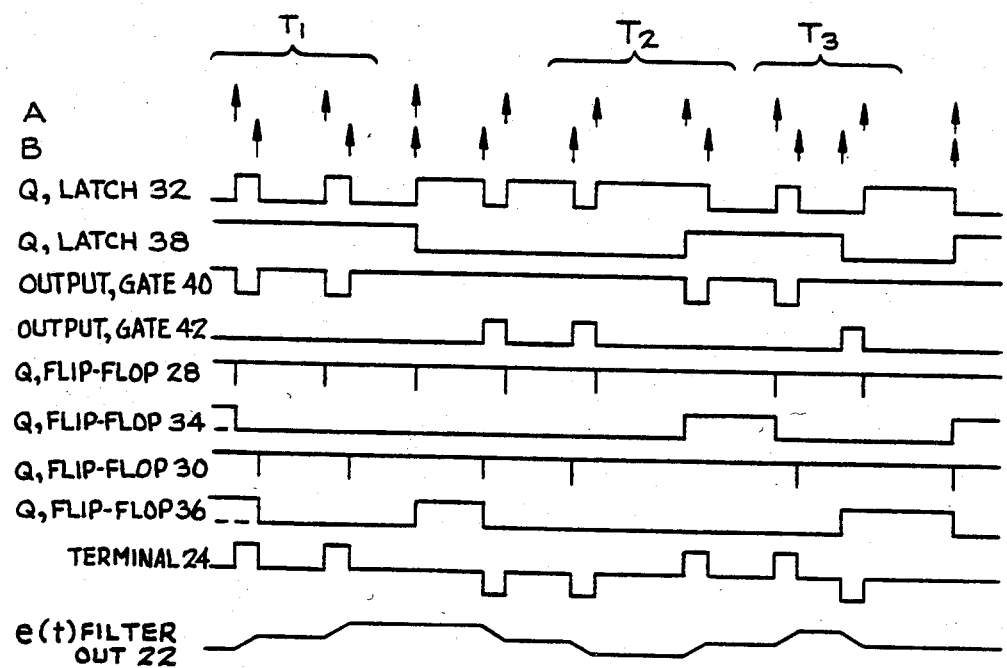
FIG_2

SIGNAL COMPARISON CIRCUIT AND PHASE-LOCKED-LOOP USING SAME

FIELD OF THE INVENTION

The present invention relates to logic gate arrays of the type implemented by, for example, CMOS, NMOS and bipolar technologies. More particularly, the invention relates to a circuit for comparing the frequencies of two signals, such as a reference signal and an output signal. The invention also relates to a phase-locked-loop having a comparison circuit implementable as a gate array for comparing a reference signal to a signal representative of the output of a voltage controlled oscillator

BACKGROUND OF THE INVENTION

Much solid state circuitry now is provided by an appropriately interconnected array of logic gates formed by one of the state-of-the-art integrated circuit technologies such as CMOS, NMOS or bipolar. The cells making up the individual gates of such a gate array are basically identical. It is only the interconnections between the various gates which differentiate one digital logic circuit from another. The circuit designer provides a desired circuitry implementation, merely by controlling the interconnects between the various gate cells. The use of gate arrays simplifies and accelerates the manufacturing process.

Utilization of logic gate arrays, though, is not without its problems. A circuit designer basically has no control over the parameters of the individual cells. Thus, it generally is not possible to "tweak" a gate array of this type by, for example, changing device parameters and layout parameters to alleviate problems with synchronization, as one can do if the circuit is a customized monolithic integrated circuit.

The inability of the circuit designer to "tweak" a circuit to obtain optimum performance has limited the use of logic gate array arrangements for various purposes. For example, phase-locked-loop circuits used to assure a desired phase and frequency of a signal, rely for operation on comparison of an output signal of a voltage control oscillator with a reference signal. The phase and frequency of the output signal is then adjusted to conform to the phase and frequency of the reference signal.

A main element of prior art phase-locked-loop circuit is a phase comparator (sometimes referred to as a phase "detector"). A phase comparator is used to compare the requisite reference signal to the output of the voltage controlled oscillator. Such a comparator typically has one of two configurations: (a) "type-I" phase comparator, and a "type-II" phase comparator. A type-I phase comparator is an exclusive-OR network which operates in a manner analogous to an over-driven analog balanced mixer. A type-II phase comparator is an edge-controlled, digital memory network typically comprising four flip-flop stages, control gating and a three-state output circuit. Such a phase comparator reacts only to the edges of a reference signal and a signal representative of an error, so that the duty cycles of the signals are irrelevant.

Type-II phase comparators for phase-locked-loops have been designed for custom monolithic circuitry. For example, a typical one may be found in the *CMOS Integrated Circuit Manual* (1980) published by RCA, pages 714–717 ("The RCA CMOS/MOS Phase-Locked-Loop: A Versatile Building Block for Micro- Power Digital and Analog Applications"). However, such phase comparators are not appropriately implementable in gate arrays. Due to unexpected circuit response caused by propagation and triggering delays, some of the components of phase comparators implemented by gate arrays may have outputs which conflict with the outputs of other phase comparator components. The result can be a logic decision error, causing the phase comparator to generate a large, incorrect error signal for one or more periods of the signals whose frequency and phase are being compared. The stability and response time of the phase-locked-loop suffers as a result of such operational errors of the phase comparator.

Another problem typically associated with type-II phase comparators implemented in a gate array structure, is latch-up upon start-up. When the phase-locked-loop is first powered on, it is possible that two mutually-exclusive internal control signals could be produced simultaneously. For instance, it is possible for the Q and $\overline{Q}$ of a flip-flop to go high simultaneously, thus placing the flip-flop in an indeterminate state. Generally, extra logic is required to ensure that either this indeterminate state never can occur, or that the flip-flop can be reset out of this state if it does occur.

SUMMARY OF THE INVENTION

One aspect of the present invention is a circuit implementable by a logic gate array structure for comparing the phase and frequency of a first periodic input signal with the phase and frequency of a second periodic input signal. It utilizes a master-slave relationship to substantially obviate the problems which may be caused by propagation and triggering delays in a gate array structure. A master indication device responsive to the first and second periodic input signals indicates which of the input signals last passed through a predetermined angular position. A slave indication device, responsive to the indication of the master indication device and to the first and second input signals, indicates if one of the first and second input signals twice passed through the predetermined angular position since the other one of the first and second input signals passed through the predetermined angular position, thus indicating if one of the input signals is higher in frequency than the other. An output decoder is provided responsive to the indications of the master and slave indication devices to produce a signal if either of the first and second input signals both twice passes through the predetermined angular position since the other one of the signals does so and is also the last one of such signals to pass through the predetermined angular position (i.e., if one of the signals both is of a higher frequency than the other signal and leads the other signal in phase). The second indication device preferably is responsive to the first and second input signals after such signals have been delayed by predetermined time intervals.

The major functions provided by the master indication device most simply are provided by a memory device such as a NAND latch, while the slave indication device preferably includes a NOR latch as a memory device. The master indication device also preferably includes a first master flip-flop which produces a pulse in response to the first input signal except when a first control signal is present, and a second master flip-flop which produces a pulse in response to the second input signal except when a second control signal is present. The NAND latch is responsive to the outputs of the first and second master flip-flops, and provides the first control signal when the first master flip-flop produces a pulse and the second control signal when the second master flip-flop produces a pulse. The NAND latch thus indicates which of the two input signals leads the other in phase.

The slave indication device includes a first slave flip-flop which assumes a predetermined state in response to the simultaneous occurrence of a pulse produced by the first master flip-flop and the delayed first input signal, and a second slave flip-flop which assumes a predetermined state in response to the simultaneous occurrence of a pulse produced by the second master flip-flop and the delayed second input signal. The NOR latch then is responsive to the outputs of the first and second slave flip-flops, and indicates which of the first and second slave flip-flops last assumed their respective predetermined states. In this way it indicates which of the two input signals has a higher frequency than the other.

The output decoder preferably is designed to be responsive to the states of the NAND and NOR latches to produce a first voltage level when the NAND and NOR latches are both in a first state, and to produce a second voltage level higher than the first voltage level when the NAND and NOR latches are both in a second state. The circuit of the invention is particularly useful in a phase-locked-loop circuit, responsive to the output signal of a voltage controlled oscillator and a reference signal, for producing a control voltage for such a circuit, the amplitude of which is determined by the difference between the phase or frequency of the output signal and the phase or frequency of the reference signal. The control voltage is used in such an arrangement to control the frequency of the voltage-controlled oscillator of the phase-locked-loop.

A comparison circuit is provided by the invention that is highly stable and can operate at very high speeds. Such circuit may be implemented by gate array arrangements produced with CMOS technology—it has very low power consumption, is relatively inexpensive to fabricate, and is insensitive to fabrication variations. It is particularly useful to provide the comparison required by phase-locked-loop circuitry, using gate arrays. It does not introduce errors when the two inputs to be compared are at or near coincidence, and yet still provides very high speed operating capability. Indeed, the operating speed of the circuit is limited only by the propagation and delay times of the devices used. Moreover, each input is totally independent of the other input, so that the circuit is independent of inter-input timing. Yet, the design is such that it may be implemented by a simplified circuit which minimizes errors due to device variables and/or layout without sacrificing operating speed. Additionally, circuit latch-up upon power-up is avoided, thus preventing large output errors from occurring when the circuit is first turned on.

BRIEF DESCRIPTION OF THE DRAWINGS

These and other features of this invention will be more completely appreciated by reading the following detailed description taken in conjunction with accompanying drawings, of which:

FIG. 1 is a schematic diagram of the presently preferred embodiment of a comparison circuit in accordance with the present invention;

FIG. 2 is a timing diagram of the operation of the embodiment shown in FIG. 1; and FIG. 3 is a block diagram of a phase-locked-loop circuit incorporating the comparison circuit of FIG. 1.

DETAILED DESCRIPTION OF THE PREFERRED EMBODIMENT

A schematic diagram of a preferred exemplary embodiment of a circuitry implemented by a logic gate array 12 in accordance with the present invention, is depicted in FIG. 1. Circuitry 12 compares the frequency and phase of a first signal A, which may be the reference signal of the phase-locked-loop circuit to be described, with the frequency and phase of a second input signal B and produces an output voltage at an output terminal 24 if the frequency or phase of signal A is different from the frequency or phase of signal B. In particular, circuit 12 determines which of signals A and B have the highest frequency and further detects any phase difference between the two inputs. If the frequency of signal A is higher than the frequency of signal B, or if its phase leads that of signal B, then it is desirable to apply a positive voltage to output terminal 24 (for instance, so as to raise the output frequency of a voltage controlled oscillator (VCO) of a phase-locked-looped circuit). Likewise, if the frequency of signal A is less than the frequency of signal B, or if its phase lags that of signal B, it is desirable to apply a zero or negative voltage to output terminal 24 (for instance, in order to lower the frequency of a VCO). If the frequencies and phases of signals A and B are the same, it is desirable that output terminal 24 appear as an open circuit. The preferred embodiment of the circuit is sensitive only to the positive edges of signals A and B, thereby making the circuit immune to input duty cycle. To detect which of signals A and B have the highest frequency (if the frequencies of signals A and B are not the same), the preferred embodiment determines whether or not two or more positive edges of one of the signals occurs between two positive edges of the other signal. FIG. 2 shows that during time period $T_2$, signal A has a higher frequency than signal B.

The preferred embodiment of the comparison circuit 12 principally comprises in accordance with the present invention a master indication means, a slave indication means, and an output decoding means. The master indication means (which, in the preferred embodiment, comprises a leading-edge triggered D flip-flop 28, a leading-edge triggered D flip-flop 30, and a NAND latch 32) is provided for determining which of the A and B signals last produced a leading edge (it will be understood that any arbitrary predetermined angular position such as the falling edge, the zero crossing point, a maximum or minimum point, etc. could be used instead of the leading edge). This indicates which of the two signals leads the other in phase. The slave indication means (which in the preferred embodiment comprises a leading-edge triggered D flip-flop 34, a leading-edge triggered D flip-flop 36, and a NOR latch 38) is provided for determining if one of the signals A or B twice produced a leading-edge since the other one of the signals produced a leading edge. This indicates which of the two signals has the greater frequency. Output decoding means (which in the preferred embodiment comprises a NAND gate 40, a NOR gate 42, a p-MOSFET 44 and n-MOSFET 46) are provided for applying appropriate voltages to terminal 24 if predetermined conditions exist, as mentioned previously and to be discussed in greater detail below. Finally, delay means are provided for delaying the A and B signals by predetermined time intervals. Specifically, first delay means, which in the preferred embodiment comprise NAND gates 48 and 50, are provided for delaying the A signal by a predetermined time interval, while second delay means (which comprise NAND gates 52 and 54 in the preferred embodiment) are provided for delaying the B signal a predetermined time interval. Flip-flops 34 and 36 are responsive to the delayed signals A and B in order to permit them to function as slaves to flip-flops 28 and 30, respectively, as will be explained below.

Operation of the described embodiment will be best understood by studying the schematic diagram of FIG. 1 in conjunction with the timing diagram of FIG. 2. It will be asssumed that NAND latch 32 is initially reset (i.e., Q=0, $\overline{Q}$=1) for reasons which will become apparent shortly (of course, the embodiment will function equally as well if NAND latch 32 is initially set; the NAND latch is assumed to be initially reset in order to simplify the discussion).

If NAND latch 32 is initially reset, a logic level zero will be applied to the D input of flip-flop 28. For reasons which will become apparent below, flip-flop 28 will normally be set, i.e., the Q output of the flip-flop will be at logic level 1. When a leading edge occurs in input signal A (which is applied to the clock input of flip-flop 28), flip-flop 28 becomes reset, i.e., the Q output of the flip-flop goes to logic level 0, the value of the D input of the flip-flop at the time that a leading edge is applied to the flip-flop clock input.

The Q output of flip-flop 28 is connected to the $\overline{S}$ input of NAND latch 32. The truth table for NAND latch 32 is as follows:

| Truth Table For NAND Latch 32 | | | |
|---|---|---|---|
| Inputs | | Outputs | |
| Reset | Set | Q | $\overline{Q}$ |
| 0 | 1 | 0 | 1 |
| 1 | 0 | 1 | 0 |
| 0 | 0 | 1 | 1 |
| 1(Last 0) | 1 | 0 | 1 |
| 1 | 1(Last 0) | 1 | 0 |

As will be understood, when the logic level 0 output of flip-flop 28 occurs, NAND latch 32 will set, i.e., its Q output will go to logic level 1 and its $\overline{Q}$ will go to logic level 0. Q output of NAND latch 32 is connected back to the D input of flip-flop 28, and also to the asynchronous set ("present") input of the flip-flop. When the Q output of NAND latch 32 goes to logic level 1, flip-flop 28 will asynchronously set, i.e., its Q output will return to logic level 1. It therefore will be understood that the combination of flip-flop 28 and NAND latch 32 generates a negative pulse of a width determined by the settling times, i.e., the propagation delay and set-up times, of the flip-flop and the NAND latch. In other words, flip-flop 28 will normally be set; upon the occurrence of a leading edge of signal A, flip-flop 28 will produce a logic level 0 on its Q output for a short time, i.e., until NAND latch sets and asynchronously sets the flip-flop.

Flip-flop 30 is connected to input signal B in the same manner that flip-flop 28 is connected to input signal A, and functions in precisely the same manner. The Q output of flip-flop 30 is connected to $\overline{R}$ input of NAND latch 32, while the D and S inputs of the flip-flop are connected to the $\overline{Q}$ output of the NAND latch. It will be understood that NAND latch 32 sets upon each leading edge of the input signal A, while the NAND latch resets upon each leading edge of input signal B.

NAND latch 32 will therefore always indicate which input signal, A or B, produced the last leading edge, as can clearly be seen in the period $T_1$ of FIG. 2.

Now suppose that two leading edges of input signal A occur before the next leading edge of input signal B (as can be seen for period $T_2$ of FIG. 2). Upon the occurrence of the last leading edge of input signal B, NAND latch 32 would have reset. When the first leading edge of input signal A occurs, flip-flop 28 generates a negative pulse (i.e., logic level 0) which sets NAND latch 32 (which, in turn sets flip-flop 28). If another leading edge of input signal A occurs before the next leading edge of input signal B, the Q output of flip-flop 28 will not assume the value appearing on the D input of the flip-flop because a logic level 1 appears on the D input of flip-flop 28. A negative pulse therefore will not be generated by the flip-flop (the Q output of the flip-flop is already at logic level 1). Hence, flip-flop 28 will only produce a negative pulse for the first leading edge of input signal A occurring after a leading edge of input signal B; likewise, flip-flop 30 will only produce a negative pulse for the first leading edge of input signal B occurring after a leading edge of input signal A.

The Q output of flip-flop 28 is connected to the D input of flip-flop 34 (as well as to the $\overline{S}$ input of NAND latch 32). Input signal A is connected to a means for delaying the input signal by a predetermined time, which in turn is connected to the clock input of flip-flop 34. Although in the preferred embodiment, the means for delaying input signal A comprises a NAND gate 48 connected in series with a NAND gate 50, it will be understood by those skilled in the art that many different circuit configurations introducing a finite, predetermined time delay could be used instead, and that the number and nature of the components used to introduce the delay can be selected so as to determine the length of the predetermined delay interval. The predetermined time which NAND gates 48 and 50 delay input signal A is selected to be greater than the signal settling time, i.e., the propagation time of flip-flop 28 and set-up time of the flip-flop 34, but less than the set-up time of the flip-flop 34 plus the pulse width of the negative pulse produced by flip-flop 28. Flip-flop 34 thus functions as a slave flip-flop to flip-flop 28 by sampling its output during the time that a negative pulse is (or would be) produced. Ideally, flip-flop 34 should sample the negative pulse produced by flip-flop 28 somewhere in the center of the width of the negative pulse. The width of the negative pulse can be adjusted by a variety of methods, such as by placing a delay in the loop from NAND latch 32 back to the inputs of flip-flop 28, by selecting the propagation speeds and set-up times of flip-flop 28 and the NAND latch, etc. A wider pulse would, of course, result in higher reliability and tolerance variation capability of the circuit, while limiting the speed of the overall circuit. The pulse width of the negative pulse produced by flip-flop 28 and the delays produced by NAND gates 48 and 50 are selected consistent with these requirements.

Flip-flop 34 will be clocked a short time period afer flip-flop 28 is clocked. Therefore, the Q output of slave flip-flop 34 will assume the value of the Q output of flip-flop 28 for each leading edge of input signal A. If flip-flop 28 produces a negative pulse, then flip-flop 34 will be reset (i.e., its Q output will go to logic level 0); likewise, if flip-flop 28 does not produce a negative pulse upon a leading edge of input signal A (because the leading edge is not the first leading edge after a leading edge of input signal B), flip-flop 34 will be set (i.e., its Q output will go to logic level 1). Flip-flop 36 and delay elements 52 and 54 are connected in a manner similar to flip-flop 34 and delay elements 48 and 50, and function in an analogous manner.

The Q output of flip-flop 34 is connected to the S input of a NOR latch 38, while the Q output of flip-flop 36 is connected to the R input of the NOR latch. The truth table for NOR latch 38 is as follows:

| Truth Table For NOR Latch 38 | | |
|---|---|---|
| Inputs | | Output |
| Reset | Set | Q |
| 0 | 1 | 1 |
| 1 | 0 | 0 |
| 1 | 1 | 0 |
| 0 | 0(Last 1) | 1 |
| 0(Last 1) | 0 | 0 |

NOR latch 38 will be set if flip-flop 34 was the last one of flip-flops 34 and 36 to be set. Likewise, NOR latch 38 will be reset if flip-flop 36 was the last one of flip-flops 34 and 36 to be set. It will be apparent that NOR latch 38 will be set whenever two leading edges of input signal A have occurred since the last leading edge of input signal B, and will be reset whenever two leading edges of input signal B have occurred since the last leading edge of input signal A. NOR latch 38 therefore indicates which one of input signals A and B have the higher frequency. Analogously, NAND latch 32 indicates which one of input signals A and B leads the other in phase. Of course, once NOR latch 38 is set, it will not be reset until input signal B has a higher frequency than input signal A (and vice versa).

An output decoder comprising a NAND gate 40 and a NOR gate 42 decodes the outputs of NAND latch 32 and NOR latch 38. The Q output of NAND latch 32 is connected to one input of each of NAND gate 40 and NOR gate 42, while the Q output of NOR latch 38 is connected to the other one of the inputs of each of the NAND and NOR gates. The output of NAND gate 40 is connected to the gate of a p-type MOSFET 44, which is connected in series with a n-type MOSFET 46 between a fixed positive voltage $V_{cc}$ and ground potential. The output of NOR gate 42 is connected to the gate of n-MOSFET 46. The p-type MOSFET 44 will turn ON in this configuration when a 0 or negative voltage is applied to its gate, while the n-MOSFET 46 will turn ON when a positive voltage is applied to its gate. NAND gate 40 normally produces a logic level 1 output, and produces a logic level 0 output only when the Q output of NAND latch 32 and the Q output of NOR latch 38 both go to logic level 1. p-MOSFET 44 will therefore turn on whenever input signal A has a higher frequency than input signal B and the positive edge of signal A has occurred and the positive edge of signal B has not occurred. When turned on p-MOSFET 44 will apply a positive potential to output terminal 24, which is connected to the junction of FETs 44 and 46. When circuit 12 is connected in the phase-locked-loop (PLL) circuit 10 arrangement shown in FIG. 3 to be described, this condition would indicate that the divided output frequency of its VCO 16 is less than the reference frequency. Comparison circuit 12 would therefore apply a more positive voltage to the input terminal 22 of the VCO 16 to raise the VCO output frequency. In an analogous manner, the output of NOR gate 42 is normally at logic level 0, and will rise to logic level 1 only when the Q output of NAND latch 32 and the Q output of NOR latch 38 are at logic level 0. This condition occurs when input signal B has a higher frequency than input signal A and the positive edge of signal B has occurred and the positive edge of signal A has not occurred (the period $T_3$ shown in FIG. 2). When comparison circuit 12 is connected in the phase-locked-loop circuit 10 shown in FIG. 3, this condition occurs when the divided output frequency of VCO 16 is greater than the reference frequency. This will cause n-MOSFET 46 to turn ON, thereby connecting output terminal 24 to ground potential. The capacitors within filter 14 are discharged so that a lower voltage is applied to input terminal 22 of VCO 16. The frequency of VCO 16 will decrease, thereby lowering the divided VCO frequency to match the reference frequency. Because of the almost infinite OFF resistances of MOSFETs 44 and 46, output terminal 24 will appear to filter 14 of the phase-locked-loop circuit 10 as an open circuit when input signals A and B have the same frequency and phase, which is a desirable result. In other words, the output decoder is a tri-state device.

The following is a table summarizing the operation of the output decoder:

| Output Decoder | | |
|---|---|---|
| INPUTS | | OUTPUT |
| Q, LATCH 32 | Q, LATCH 38 | Terminal 24 |
| 0 | 0 | 0 Volts (FREQ B > FREQ A) |
| 0 | 1 | OPEN CIRCUIT (FREQ B = FREQ A) |
| 1 | 0 | OPEN CIRCUIT (FREQ B = FREQ A) |
| 1 | 1 | $+V_{cc}$ (FREQ A > FREQ B) |

A phase-locked-loop circuit 10 of the invention incorporating the comparison circuit is shown in FIG. 3 The circuit 10 also has a filter 14, a voltage-controlled oscillator (VCO) 16 and a frequency divider 18. VCO 16 produces an output signal at output terminal 20, the frequency of which is determined by the amplitude of a control voltage applied to an input terminal 22. When ½ of the $V_{cc}$ voltage (FIG. 1) is applied to input 22 of VCO 16, the output frequency of the VCO produced at output terminal 20 will assume a relatively fixed, center frequency. Typically, if the control voltage applied to input terminal 22 increases, the frequency of the signal produced at output terminal 20 will also increase; likewise, if the control voltage applied to input terminal 22 decreases, the output frequency of VCO 16 will decrease. In this way, the output frequency produced by PLL 10 is controlled.

Output terminal 20 of VCO 16 is connected to a frequency divider 18 which divides the output frequency of the VCO by a predetermined number, typically an integer. The frequency is divided in order to permit circuit 12 to compare signals of relatively low frequencies (since VCO 16 may operate at a very high frequency). Frequency divider 18 provides the divided output signal of VCO 16 to the "B" input of the circuit 12. An externally-generated reference signal is applied to the "A" input of the circuit 12. The reference signal is often, but not always, produced by a stable frequency source, such as a crystal oscillator. Comparison circuit 12 compares the phase and frequency of the reference signal with the phase and frequency of the divided output signal of VCO 16, and produces an output signal at output terminal 24. This signal is filtered by a filter 14 to integrate the signal in order to achieve stable loop performance, and is applied as an error signal e(t) (FIG. 2) to input terminal 22 of VCO 16. The amplitude of error signal e(t) varies proportionally to the difference in phase and frequency of the reference signal with respect to the divided output signal of VCO 16. When the frequency of the reference signal applied to input A of circuit 12 is sufficiently close to the frequency of the output of VCO 16 as divided by the frequency divider 18, the closed-looped nature of PLL 10 forces the VCO to "lock" in frequency with the reference signal input, i.e., the B input frequency is identical to the reference signal frequency. If the output frequency of VCO 16 changes, phase comparator 12 will detect the difference in frequency and phase between the reference signal and the frequency divider output signal and will vary the amplitude of e(t) in a direction that will reduce the difference in frequency and phase between the VCO output and the reference signal.

It will be recognized from the above that each edge-triggered input to the logic array circuit is completely independent of the other input. Thus, the circuit is entirely independent of inter-input timing (due to the delay provided by delay elements 48 and 50 and delay elements 52 and 54). In this way, the states of flip-flops 34 and 36 (and therefore the state of NOR latch 38) is dependent upon the states of flip-flops 28 and 30, rather than directly upon the input. Circuit design and timing is simplified, and errors due to device variations and/or layout are minimized without sacrificing speed of operation. The designer need not be concerned with threshold levels or delays of different signals (except for the amount of delay provided by the delay elements 48-54 as previously discussed). The design is therefore far more tolerant of the manufacturing variables found in gate array structures (which may be implemented in any technology, for example, CMOS, NMOS, bipolar, etc.) desirable for many applications of phase-locked-looped circuits.

As another advantage of the design, large errors on the output of circuit 12 are prevented from occurring. For example, if master flip-flop 28 for some reason makes an error (due, for example, to timing or some other reason), flip-flop 34 will see the same error and will not allow a large error to occur at the output (remember that the state of NAND latch 32 must agree with the state of NOR latch 38 for an output to be generated at output terminal 24). The same is, of course, true with respect to the operation of master flip-flop 30 and slave flip-flop 36. In effect, it does not really matter if the state of flip-flop 28 is occasionally wrong so long as slave flip-flop 34 follows it. Any errors present in the operation of the circuit 12 would be corrected either at the next clock cycle or shortly thereafter, thereby minimizing any error perturbations occurring at the output. The result is highly accurate control of the frequency of VCO 16.

Latch-up is also prevented when comparison circuit 12 is initially powered up. This occurrence could be very detrimental, resulting not only in latch-up of the entire circuit, but destruction of MOSFETs 44 and 46 due to overcurrent. This latch-up prevention feature is provided by NAND latch 32 and NOR latch 38. Upon first powering up, it is conceivable that a signal may be applied at precisely the same time to the $\overline{S}$ and $\overline{R}$ inputs of NAND latch 32 or to the S and R inputs of NOR latch 38. If this occurs, the Q and $\overline{Q}$ outputs of the latches will not be in opposite states. In accordance with the present invention, if the $\overline{S}$ and $\overline{R}$ inputs of NAND latch 32 are both at logic level 0, then the Q and $\overline{Q}$ outputs of the NAND latch will both be at logic level 1. This will, of course, cause flip-flops 28 and 30 to become set, which will cancel the logic level 0 signals applied to the inputs of NAND latch 32. In this way, a stable state where the Q and $\overline{Q}$ outputs of NAND latch 32 are the same cannot result.

Although exemplary embodiments have been described in detail above, those skilled in the art will appreciate that many variations and modifications may be made without departing from the novel and advantageous features of the invention. For example, different output decoders might be used for the comparison circuit 12 if it is employed in applications other than phase-locked-loop circuits. For instance, it might be desirable in some applications to recognize not merely when one input signal has a higher frequency than another input signal, but also when one input signal lags or leads the other in phase (information which is provided by NAND latch 32). The circuit is useful in many applications as a replacement for a standard phase comparator, although it was designed to overcome the specific problems presented by gate array structure technology. Moreover, the present invention is by no means limited to the particular components described above, but rather, could be implemented in a variety of other different ways using digital logic devices, switching transistors, etc. Likewise, means other than flip-flops 28 and 30 might be used to produce negative pulses. Although D flip-flops are used in the preferred embodiment, other types of flip-flops or other indication or memory elements could be used instead. Accordingly, all such variations and modifications are intended to be included within the scope of the claims.

What is claimed is:

1. A digital comparison circuit implementable as a gate array for comparing the phase and frequency of a first periodic input signal with the phase and frequency of a second periodic input signal comprising:

first pulse producing means for producing a pulse in response to said first input signal except when a first control signal is present;

second pulse producing means for producing a pulse in response to said second input signal except when a second control signal is present;

first control signal producing means, responsive to the relative timing of the pulses produced by said first and said second pulse producing means, for providing said first control signal when said first pulse producing means produces a pulse after said second pulse producing means last produces a pulse and for producing said second control signal when said second pulse producing means produces a pulse after said first pulse producing means last produces a pulse, said first and second control signals being mutually exclusive;

first gate delay means for delaying said first input signal;

second gate delay means for delaying said second input signal;

first logic means, responsive to said delayed first input signal until said first pulse producing means produces a pulse, for producing an output in response to said delayed first input signal when said first pulse producing means does not produce a pulse in response to said first input signal;

second logic means, responsive to said delayed second input signal until said second pulse producing means produces a pulse, for producing an output in response to said delayed second input signal when said second pulse producing means does not produce a pulse in response to said second input signal;

second control signal producing means, responsive to the outputs of said first and second logic means, for producing a third control signal when the output of said first logic means is applied until the output of said second logic means is applied; and output decoding means, responsive to said first and third control signals, for producing a first voltage level when said first and third control signals are simultaneously produced and for producing a second voltage level different from said first voltage level when said first and third control signals are simultaneously not produced.

2. A circuit as in claim 1 wherein said output decoding means acts as an open circuit when it is not producing either said first or said second voltage levels.

3. A circuit as in claim 1 wherein said first control signal producing means comprising a NAND latch and said second control signal producing means comprising a NOR latch.

4. A circuit as in claim 1 wherein said second delay means is adapted to delay said second input signal by a predetermined time interval which exceeds the signal settling time of said second pulse producing means.

5. A circuit as in claim 1 wherein said first delay means is adapted to delay said first signal by a predetermined time interval which exceeds the signal settling time of said first pulse producing means.

6. A circuit as in claim 5 wherein said second delay means is adapted to delay said second input signal a predetermined time interval which exceeds the signal settling time of said second pulse producing means.

7. A phase-locked-loop for producing a periodic output signal having a predetermined frequency determined by the frequency of a reference signal, including:

oscillator means for producing an output signal whose frequency varies in response to a control signal; and a comparison circuit implementable as a gate array, which circuit is responsive to said output signal and to said reference signal for producing said control signal indicative of the difference between the phase and frequency of said output signal and the phase and frequency of said reference signal, said array comprising:

master indication means for indicating which of said reference signal and said output signal last passed through a predetermined angular position;

means for delaying said output signal and said reference signal;

slave indication means, responsive to the indication of said master indication means and to said delayed reference and output signals, for indicating if one of said reference and said output signals twice passed through said predetermined angular position since the other one of said reference and output signals passed through said predetermined angular position; and output decoding means, responsive to the indications of said master and said slave indication means, for producing a first control signal if said reference signal twice passed through said predetermined angular position since said output signal passed through said predetermined angular position and was also the last one of said reference and output signals to pass through said predetermined angular position, and for producing a second control signal different from said first control signal if said output signal twice passed through said predetermined angular position since said reference signal passed through said predetermined angular position and was also the last one of said reference and output signals to pass through said predetermined angular position.

8. An apparatus as in claim 7 wherein said output decoding means acts as an open circuit when it is not producing either said first or said second control signals.

9. A phase-locked-loop for producing a periodic output signal having a predetermined frequency determined by the frequency of a reference signal, including:

voltage controlled oscillator means for producing an output signal whose frequency varies in response to the level of a control voltage; and a comparison circuit implementable as a gate array, which circuit is responsive to said output signal and to said reference signal for producing said control voltage, the level of which is determined by the difference between the phase and frequency of said output signal and the phase and frequency of said reference signal, comprising:

master indication means for indicating which of said reference and output signals last passed through a predetermined angular position;

slave indication means, responsive to the indication of said master indication means and to said reference and output signals, for indicating if one of said reference and said output signals twice passed through said predetermined angular position since the other one of said reference and output signals passed through said predetermined angular position; and output decoding means, responsive to indications of said master and said slave indication means, for producing a first control voltage level if said reference signal twice passed through said predetermined angular position since said output signal passed through said predetermined angular position and was also the last one of said reference and said output signals to pass through said predetermined angular position, and for producing a second control voltage level different from said first control voltage level if said output signal twice passed through said predetermined angular position since said reference signal passed through said predetermined angular position and was also the last one of said reference and said output signals to pass through said predetermined angular position.

10. An apparatus as in claim 9 wherein: said master indication means further includes first master flip-flop means for producing a predetermined output in response to said reference signal except when a first control signal is present, second master flip-flop means for producing a predetermined output in response to said output signal except when a second control signal is present, and a NAND latch, responsive to the predetermined outputs of said first and second master flip-flop means, for producing said first control signal when said first master flip-flop means produces a predetermined output after said second master flip-flop means produces a predetermined output, and for producing said second control signal when said second master flip-flop means produces a predetermined output after said first master flip-flop means produces a predetermined output;

said slave indication means further includes means for delaying said reference and output signals, first slave flip-flop means for assuming a predetermined state in response to the simultaneous occurrence of a predetermined output of said first master flip-flop means and said delayed reference signal, second slave flip-flop means for assuming a predetermined state in response to the simultaneous occurrence of a predetermined output of said second master flip-flop means and said delayed output signal, and a NOR latch, responsive to the states of said first and said second slave flip-flop means, for indicating which of said first and second slave flip-flop means last assumed said respective predetermined states.

11. A digital comparison circuit implementable by a gate array structure for comparing the phase and frequency of a first periodic input signal with the phase and frequency of a second periodic input signal, comprising:

first flip-flop means, having a clock input connected to receive said first input signal, a present state output, and at least one input connected to receive a third signal, for asynchronously assuming a first state when said third signal is at a first level and for synchronously assuming a second state different from said first state when said third signal is at a second level different from said first level and said first input signal is applied;

first gate delay means for delaying said first input signal by a predetermined time interval;

second flip-flop means having a clock input connected to receive said delayed first signal, a present state output, and an input connected to the output of said first flip-flop means, for assuming the state of said first flip-flop means when said delayed first signal is applied;

third flip-flop means having a clock input connected to receive said second input signal, a present state output, and at least one input connected to a fourth signal, for asynchronously assuming a first state when said fourth signal is at a first level and for synchronously assuming a second state different from said first state when said fourth signal is at a second level different from said first level and said second input signal is applied;

second gate delay means for delaying said second input signal by a predetermined time interval;

fourth flip-flop means having a clock input connected to receive said delayed second input signal, a present state output, and an input connected to the output of said third flip-flop means for assuming the state of said third flip-flop means when said delayed second input signal is applied;

NAND latch means, having a first input connected to the output of said first flip-flop means, a second input connected to the output of said third flip-flop means, and first and second complementary outputs providing said third and fourth signals, respectively, for assuming a first state when said first flip-flop means assumes said second state and for assuming a second state different from said first state when said third flip-flop means assumes said second state;

NOR latch means having a first input connected to the output of said second flip-flop means, a second input connected to the output of said fourth flip-flop means, and a present state output, for assuming a first state when said second flip-flop means assumes said first state and for assuming a second state different from said first state when said fourth flip-flop means assumes said first state; and output decoding means, responsive to the states of said NAND and NOR latch means, for producing a first voltage level when said NAND and NOR latch means are both in said first state and for producing a second voltage level different from said first voltage level when said NAND and NOR latch means are both in said second state and for providing an open circuit connection when said NAND and NOR latch means are in different states.

12. A comparison circuit implementable by a gate array structure as in claim 11 wherein:

said predetermined time interval by which said first delay means delays said first signal is greater than the settling time of said first flip-flop means; and said predetermined time interval by which said second delay means delays said second signal is greater than the settling time of said third flip-flop means.

13. A comparison circuit implementable as a gate array for comparing first and second periodic input signals, comprising:

master indication means for indicating which of said first and second periodic input signals last passed through a predetermined angular position;

means for delaying said first and second input signals;

slave indication means responsive to the indication of said master indication means and to the output of said delaying means for indicating if one of said input signals twice passed through said predetermined angular position since the other one of said input signals passed through said predetermined angular position; and output decoding means responsive to the indications of said master and slave indication means for indicating if one of said input signals twice passed through said predetermined angular position since the other one passed through said predetermined angular position and was also the last one of said input signals to pass through said predetermined angular position.

14. A circuit as in claim 13 wherein said master and slave indication means respectively include first and second memory means.

15. A circuit as in claim 13 wherein:

said master indication means includes first master gate flip-flop means for producing a predetermined output in response to said first input signal except when a first control signal is present, second master gate flip-flop means for producing a predetermined output in response to said second input signal except when a second control signal is present, and NAND latch means, responsive to the outputs of said first and second master flip-flop means, for producing said first control signal when said first master flip-flop means last produced its predetermined output and for producing said second control signal when said second master flip-flop means last produced its predetermined output; and said slave indication means includes first slave gate flip-flop means for assuming a predetermined state in response to the simultaneous occurrence of the predetermined output of said first master flip-flop means and said delayed first input signal;

second slave gate flip-flop means for assuming a predetermined state in response to the simultaneous occurence of the predetermined output of said second master flip-flop means and said delayed second input signal, and NOR latch means, responsive to the states of said first and second slave flip-flop means, for indicating which of said first and second slave flip-flop means last assumed said respective predetermined states.

* * * * *